United States Patent
Ryan et al.

(10) Patent No.: US 11,126,248 B2
(45) Date of Patent: Sep. 21, 2021

(54) DATA STORAGE DEVICE DETECTING SUPPLY CURRENT LIMIT

(71) Applicant: Western Digital Technologies, Inc., San Jose, CA (US)

(72) Inventors: Robert P. Ryan, Mission Viejo, CA (US); Brian Johnson, Laguna Hills, CA (US); Ryan Mayo, Aliso Viejo, CA (US); Shrey Khanna, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 125 days.

(21) Appl. No.: 16/451,368

(22) Filed: Jun. 25, 2019

(65) Prior Publication Data

US 2020/0409445 A1 Dec. 31, 2020

(51) Int. Cl.
| | |
|---|---|
| *G06F 1/3234* | (2019.01) |
| *G11B 5/55* | (2006.01) |
| *G11C 16/30* | (2006.01) |
| *H02H 3/087* | (2006.01) |
| *G06F 3/06* | (2006.01) |

(52) U.S. Cl.
CPC .......... *G06F 1/3268* (2013.01); *G11B 5/5547* (2013.01); *G11C 16/30* (2013.01); *G06F 3/0617* (2013.01); *G06F 3/0674* (2013.01); *H02H 3/087* (2013.01)

(58) Field of Classification Search
CPC ..... G01R 31/74; G06F 1/3268; G06F 3/0617; G06F 3/0634; G06F 3/0674; G06F 3/0679; H02H 3/087; G11C 16/30; G11B 5/5547

See application file for complete search history.

(56) References Cited

U.S. PATENT DOCUMENTS

| | | |
|---|---|---|
| 5,844,743 A | 12/1998 | Funches |
| 6,369,972 B1 | 4/2002 | Codilian et al. |
| 7,110,214 B1* | 9/2006 | Tu ..................... G11B 5/5547 |
| | | 360/78.06 |
| 7,333,292 B2 | 2/2008 | Chu et al. |
| 7,362,565 B2 | 4/2008 | Imblum |
| 7,453,680 B2 | 11/2008 | Hallak et al. |
| 8,369,092 B2 | 2/2013 | Atkins et al. |
| 9,093,160 B1 | 7/2015 | Ellis et al. |

(Continued)

FOREIGN PATENT DOCUMENTS

| | | |
|---|---|---|
| CN | 1925000 A | 3/2007 |
| CN | 101371313 A | 2/2009 |

(Continued)

*Primary Examiner* — Terrell S Johnson
(74) *Attorney, Agent, or Firm* — Patterson & Sheridan, LLP; Steven H. Versteeg

(57) ABSTRACT

A data storage device is disclosed comprising a storage medium, an input configured to receive a supply voltage from a voltage source, and control circuitry powered by the supply voltage. The control circuitry is configured to adjust a load of the data storage device, detect a load voltage at the adjusted load, detect a load current at the adjusted load, process the detected load voltage and the detected load current to detect a current limit of the voltage source, and configure the data storage device in response to the detected current limit of the voltage source.

20 Claims, 5 Drawing Sheets

(56) References Cited

U.S. PATENT DOCUMENTS

| | | | |
|---|---|---|---|
| 9,424,868 | B1 | 8/2016 | Nicholls et al. |
| 10,014,018 | B1 * | 7/2018 | Kiyonaga ............ G11B 5/5547 |
| 10,014,108 | B2 | 7/2018 | Kiyonaga et al. |
| 10,176,840 | B1 | 1/2019 | Johnson et al. |
| 10,910,827 | B2 * | 2/2021 | Valdivia Guerrero ....................... H02H 9/002 |
| 10,930,310 | B1 * | 2/2021 | Uchida ................. G06F 3/0659 |
| 2004/0036471 | A1 * | 2/2004 | Mackay ................. B82Y 10/00 324/210 |
| 2004/0100722 | A1 | 5/2004 | Kokami |
| 2010/0329065 | A1 * | 12/2010 | Johnston ................... G05F 1/46 365/229 |
| 2013/0080680 | A1 | 3/2013 | Chu |
| 2013/0290611 | A1 | 10/2013 | Biederman et al. |
| 2016/0270250 | A1 | 9/2016 | Chen et al. |
| 2017/0060152 | A1 | 3/2017 | Martini |
| 2020/0409445 | A1 * | 12/2020 | Ryan .................... G11B 5/5547 |

FOREIGN PATENT DOCUMENTS

| | | |
|---|---|---|
| CN | 102004686 A | 4/2011 |
| CN | 102077290 A | 5/2011 |
| CN | 103001202 A | 3/2013 |
| CN | 103021435 A | 4/2013 |
| CN | 108630237 A | 10/2018 |
| WO | 2014111920 A1 | 7/2014 |

* cited by examiner

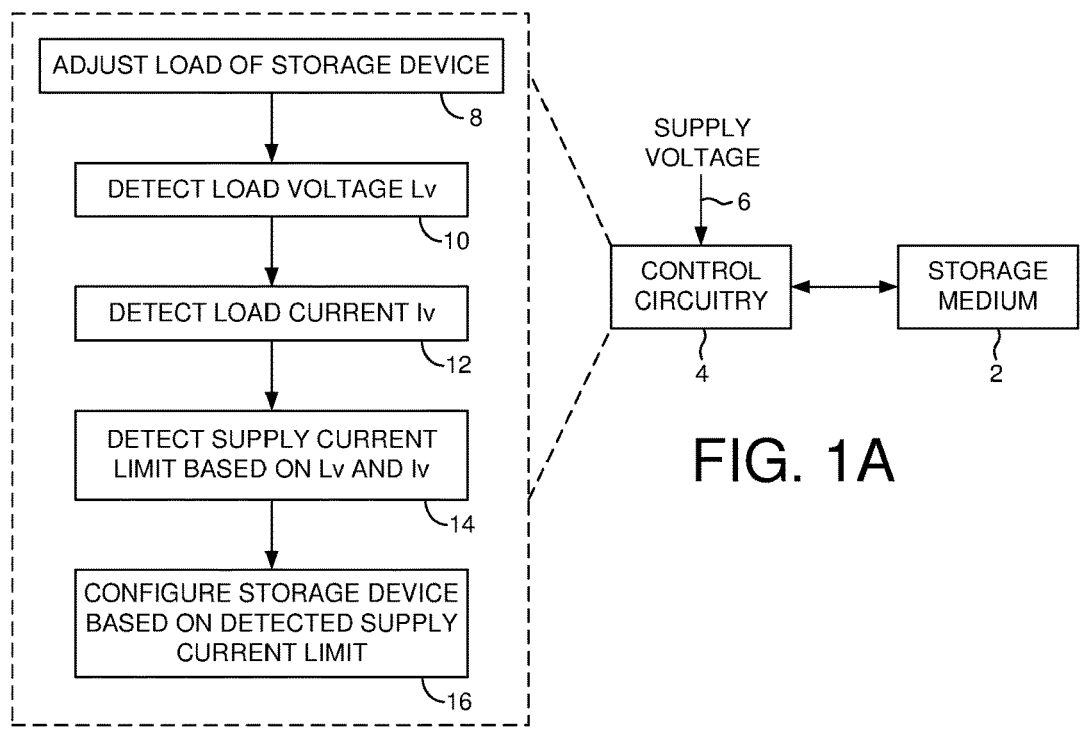
FIG. 1A
FIG. 1B
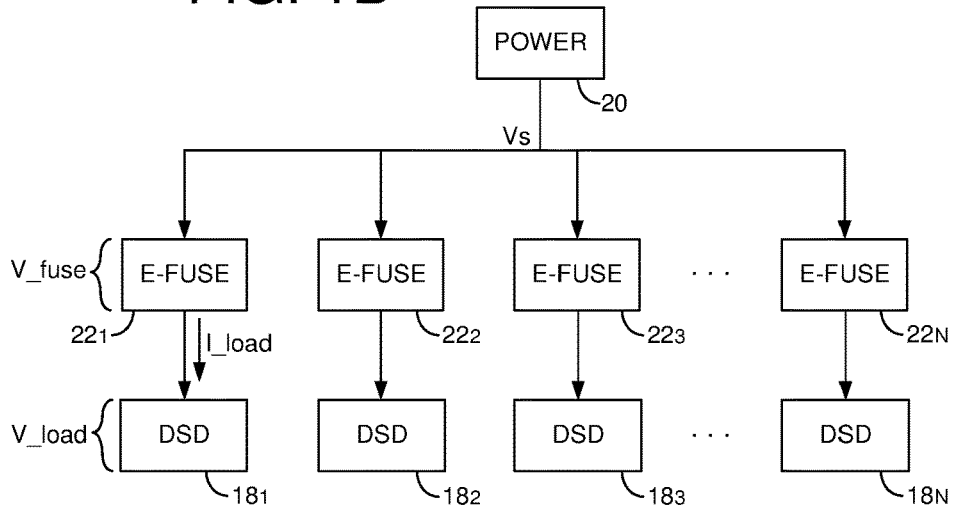
FIG. 1C
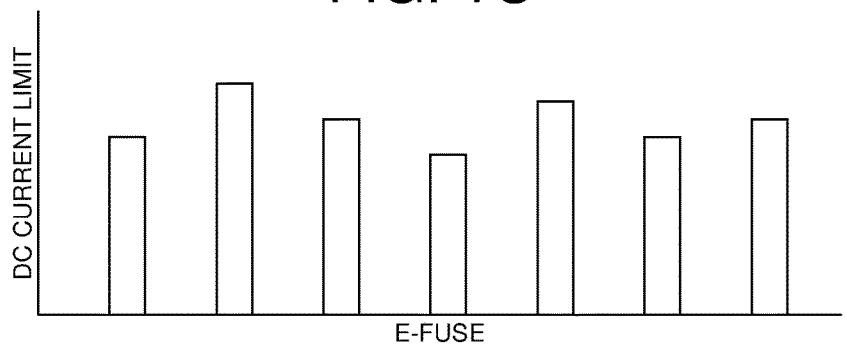
FIG. 1D

DATA STORAGE DEVICE DETECTING SUPPLY CURRENT LIMIT

BACKGROUND

Data centers employ large arrays of data storage devices typically in the form of hard disk drives (HDDs) or solid state drives (SSDs). The data storage devices are typically mounted in a chassis capable of housing a number of the storage devices, with a number of the chassis being mounted into a storage rack. Each chassis typically sources one or more supply voltages to the data storage devices, such as a 12v supply for powering a spindle motor and voice coil motor(s), and a 5v supply for powering the control circuitry of a disk drive. The manufacturer of the chassis typically provides specifications to the manufacturer of the data storage devices concerning, for example, a maximum current that should be drawn from each supply voltage while in operation. In addition, the chassis may be manufactured with an E-fuse circuit that limits the maximum current that may be drawn by each data storage device. If a data storage device draws an excessive amount of current, the E-fuse circuit will "open" to prevent an overload condition.

BRIEF DESCRIPTION OF THE DRAWINGS

FIG. 1A shows a data storage device according to an embodiment comprising a storage medium and control circuitry powered by a supply voltage received from a voltage source.

FIG. 1B is a flow diagram according to an embodiment wherein a current limit of the voltage source is detected based on a detected load voltage and a detected load current.

FIG. 1C shows an embodiment wherein a number of data storage devices are mounted into a chassis of a storage rack, wherein the supply current to each data storage device is limited by an E-fuse.

FIG. 1D shows an embodiment wherein a DC current limit may vary across the E-fuses of the chassis.

DETAILED DESCRIPTION

Figure 2:
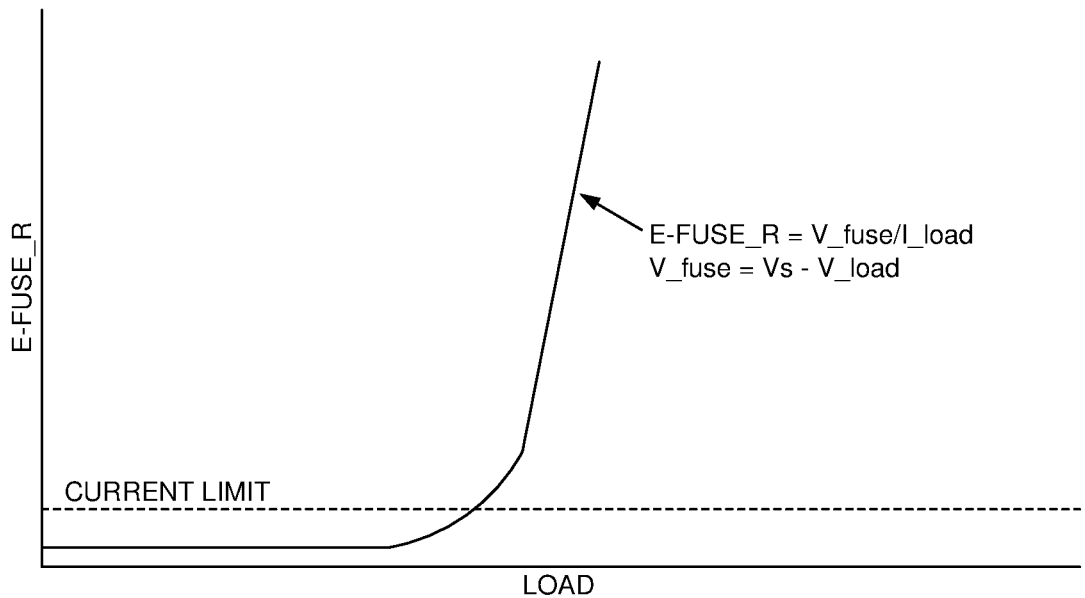
FIG. 2 shows an embodiment wherein the current limit of an E-fuse is measured by increasing a load within the data storage device and detecting when a resistance of the E-fuse exceeds a threshold.

FIG. 1A shows a data storage device according to an embodiment comprising a storage medium 2 and control circuitry 4 powered by a supply voltage 6 received from a voltage source. The control circuitry 4 is configured to execute the flow diagram of FIG. 1B wherein a load of the storage device is adjusted (block 8), a load voltage is detected at the adjusted load (block 10), and a load current is detected at the adjusted load (block 12). The detected load voltage and the detected load current are processed to detect a current limit of the voltage source (block 14), and the data storage device is configured in response to the detected current limit of the voltage source (block 16).

FIG. 1C shows an embodiment wherein a number of data storage devices (DSDs) $18_1$-$18_N$ are mounted into a chassis of a storage rack. A power supply 20 generates a supply voltage Vs and corresponding supply current applied to each data storage device through a current limiting electronic fuse (E-fuse) $22_1$-$22_N$. In one embodiment shown in FIG. 1D, the DC current limit of each E-fuse may vary across the devices due to manufacturing tolerances. In addition, a transient response of the E-fuses may vary across the devices meaning that each E-fuse may conduct a different peak current during a transient load condition of the data storage device. Conventionally, each data storage device is configured so as to not exceed a minimum DC current limit of a worst case E-fuse, thereby ensuring none of the E-fuses open under all load conditions. However, configuring all of the data storage devices mounted in a chassis so as to not exceed the minimum DC current limit of the E-fuses means that at least some of the data storage devices will perform at a suboptimal level. Accordingly, in one embodiment the control circuitry 4 within each data storage device detects the current limit of its respective E-fuse, and then optimizes the operating performance, for example, to maximize a throughput of the data storage device based on the detected current limit. In one embodiment, the control circuitry 4 may detect a DC current limit and/or an AC current limit of its E-fuse in order to configure different operating modes of the data storage device (e.g., configure the maximum DC and AC loads corresponding to the respective current limits of the E-fuse).

Any suitable technique may be employed to detect the current limit of the E-fuse, wherein in an embodiment shown in FIG. 2, the control circuitry 4 may adjust a load of the data storage device while measuring a resistance of the E-fuse. The resistance of the E-fuse may be measured as the voltage across the E-fuse divided by the current flowing through the E-fuse. The voltage across the E-fuse (V_fuse) may be measured by subtracting a detected load voltage (V_load) within the data storage device from the known supply voltage Vs generated by the power supply 20 of FIG. 1C. The current limit of the E-fuse may then be detected when the measured resistance of the E-fuse exceeds a predetermined threshold as shown in FIG. 2. That is, as a load within the data storage device increases, the supply current flowing through the E-fuse will increase until reaching the current limit of the E-fuse, thereby causing the resistance of the E-fuse to increase as the fuse transitions into an open state.

Figure 3A:
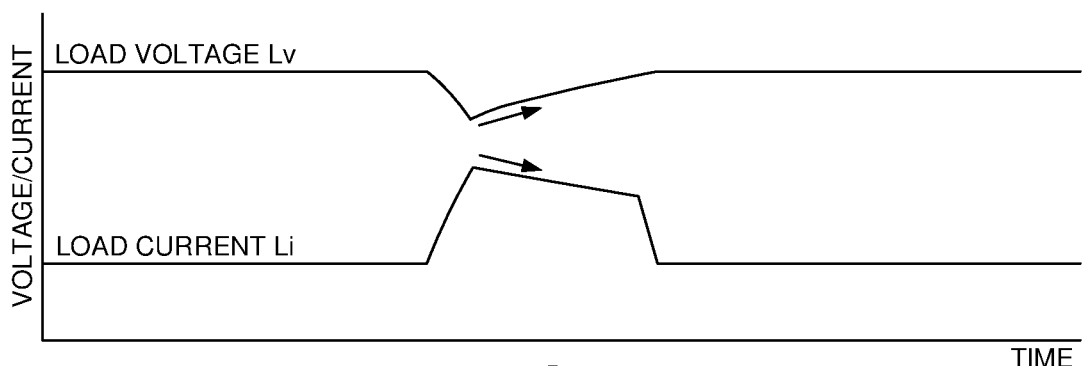
FIGS. 3A and 3B show an embodiment wherein the current limit of an E-fuse is measured by creating a transient load within the data storage device and detecting when a slope polarity of the supply voltage matches a slop polarity of the supply current.
Figure 3B:
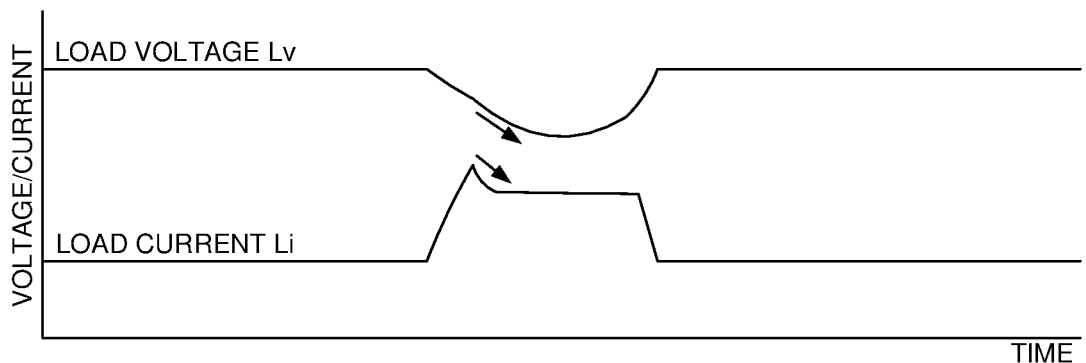

FIGS. 3A and 3B show an alternative embodiment for detecting the current limit of the E-fuse. In this embodiment, the control circuitry 4 monitors a slope polarity of a detected load voltage and a detected load current while adjusting a load of the data storage device. Referring to FIG. 3A, as the load current increases the load voltage decreases due to the load current increasing the voltage drop across the power supply 20 and E-fuse. If the current limit of the E-fuse is not reached, when the load current decreases (negative slope), there is a corresponding increase in the load voltage (positive slope) as shown in FIG. 3A. However, if the current limit of the E-fuse is reached such that the resistance of the E-fuse begins increasing, the transient response of the E-fuse will cause the load voltage to decrease (negative slope) even though the load current is decreasing (negative slope) as shown in FIG. 3B. Accordingly, in one embodiment in order to detect the current limit of the E-fuse a transient load of the data storage device is increased until the slope polarity of the detected load voltage matches the slope polarity of the detected load current during at least part of the transient load condition.

Figure 4A:
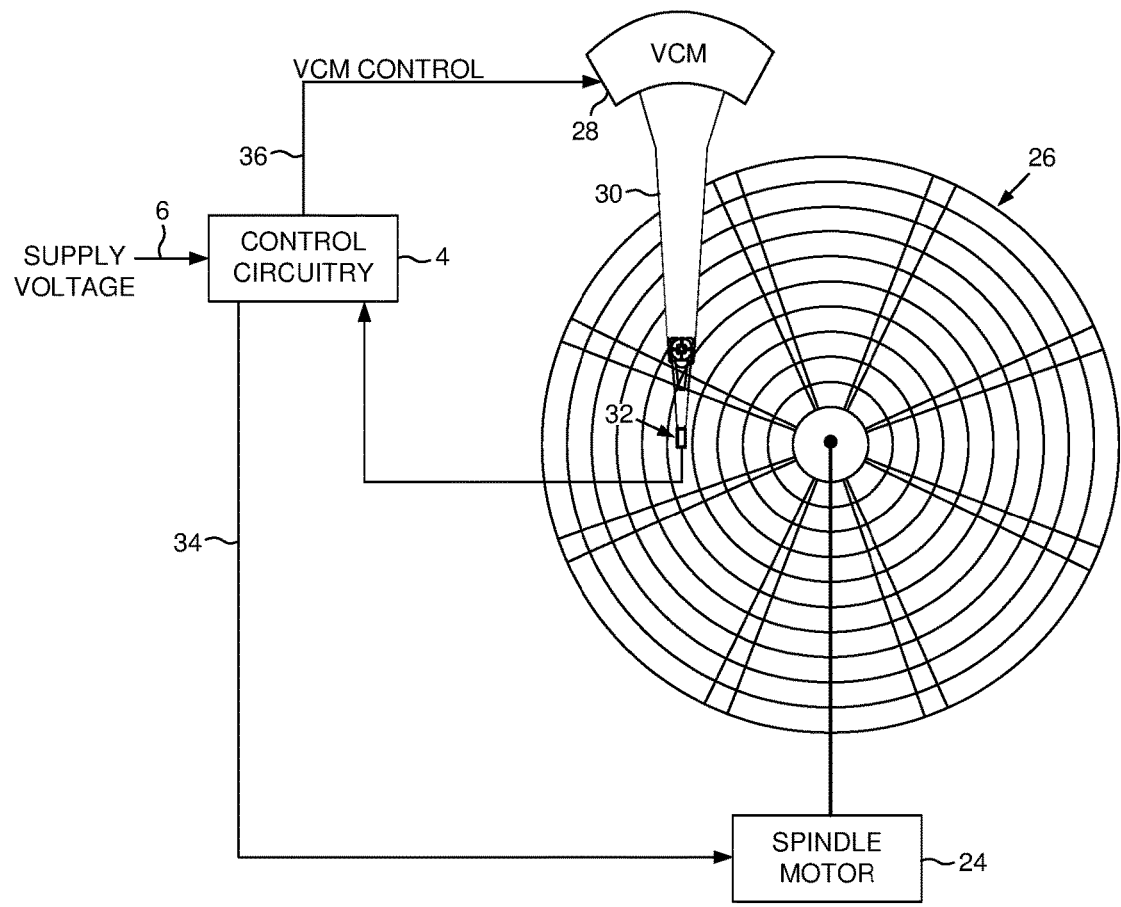
FIG. 4A shows a data storage device in the form of a disk drive according to an embodiment comprising spindle motor for rotating a disk, and a head actuated over the disk by a voice coil motor (VCM).
Figure 4B:
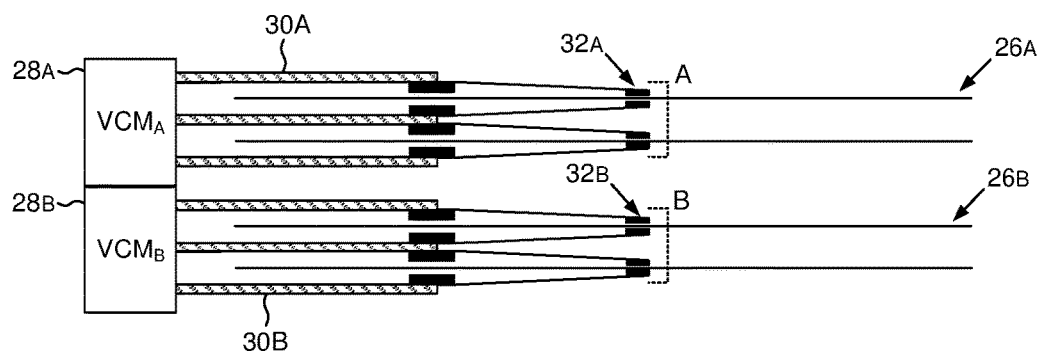
FIG. 4B shows a disk drive according to an embodiment comprising a split actuator for actuating respective sets of heads over respective disk surfaces.

FIG. 4A shows a data storage device in the form of a disk drive according to an embodiment comprising a spindle motor 24 configured to rotate a disk 26. A voice coil motor (VCM) 28 rotates an actuator arm 30 about a pivot in order to actuate a head 32 radially over the disk 26. The control circuitry 4 applies a control signal 34 to the spindle motor 24 in order to control a rotation speed of the disk 26, and applies a control signal 36 to the VCM 28 based on a seek profile in order to seek the head 32 over the disk 26 to access target data tracks. In an embodiment shown in FIG. 4B, the disk drive may comprise multiple VCMs (e.g., VCM 28A and VCM 28B) configured to rotate respective sets of actuator arms 30A and 30B. The multiple VCMs may comprise a split-actuator configuration wherein the VCMs rotate their respective actuator arms about a common pivot as in the embodiment of FIG. 4B, or each VCM may actuate respective actuator arms about independent pivots.

In one embodiment, when detecting the current limit of the E-fuse the control circuitry 4 increases a load of the disk drive by applying a driving current to either or both of the VCM(s) and/or to the spindle motor. The driving current may be applied to the VCM(s) and/or the spindle motor during normal access operations, or during a calibration procedure which may be executed periodically or when the disk drive is powered on. For example, in one embodiment when the disk drive is powered on the control circuitry 4 may apply a driving current to the VCM 28 while the heads are parked on a ramp (e.g., drive the VCM 28 against a crash stop in order to increase a load of the disk drive). In one embodiment, the control circuitry 4 may apply a driving current concurrently to two or more VCMs in order to further increase the load of the disk drive (e.g., in an embodiment where each VCM may have a current limit before damaging the voice coil or run out of voltage headroom). In yet another embodiment, when powered on the control circuitry 4 may apply a driving current to the spindle motor 24 while the spindle motor is stopped (e.g., by applying a driving current during a fixed commutation state of the spindle motor). In one embodiment, the control circuitry 4 may confirm the spindle motor is not rotating (e.g., by evaluating the back electromotive force BEMF voltage of the spindle motor) before applying the driving current to the spindle motor during the calibration procedure. In still another embodiment, when powered on the control circuitry 4 may apply a driving current to the spindle motor in order to spin-up the disk(s) toward a target rotation speed and concurrently apply a driving current to at least one VCM (e.g., in order to drive the VCM toward a crash stop). This embodiment may reduce or eliminate any delay during power-on since the current limit of the E-fuse may be detected during the normal spin-up operation of the disk drive.

Figure 5A:
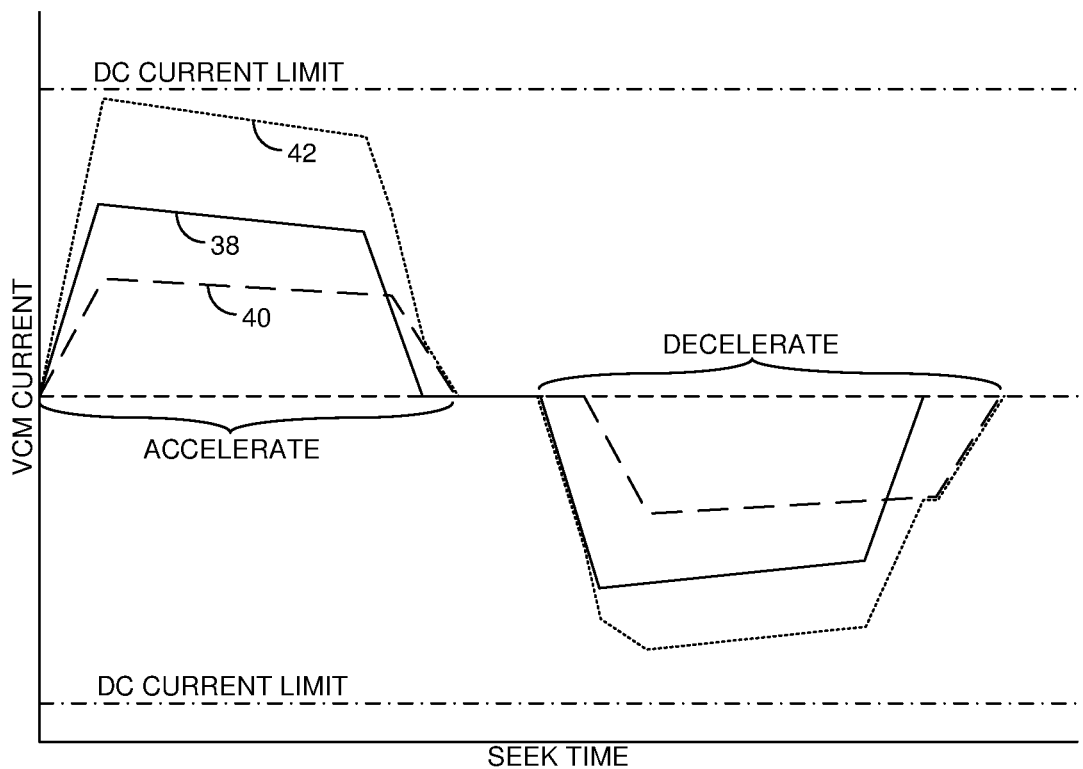
FIG. 5A shows an embodiment wherein the seek profiles of multiple VCMs are configured so as to not exceed the detected current limit of the voltage source.

The control circuitry 4 may configure the disk drive in any suitable manner based on the detected current limit of the E-fuse. In one embodiment, the control circuitry 4 may configure a seek profile of the VCM 28, for example, by limiting a driving current during an acceleration and/or deceleration phase of a seek so as not to exceed the detected current limit of the E-fuse. In an embodiment wherein a concurrent seek of multiple VCMs may be executed, the seek profiles for each VCM may be configured so that the combined current does not exceed the detected current limit of the E-fuse. An example of this embodiment is shown in FIG. 5A wherein a first seek profile 38 of a first VCM 28A and a second seek profile 40 of a second VCM 28B are configured so that the combined seek profile 42 does not exceed the detected current limit of the E-fuse. In this manner, the disk drives powered through an E-fuse having a higher current limit may be configured to operate with higher performance by using more aggressive seek profiles.

Figure 5B:
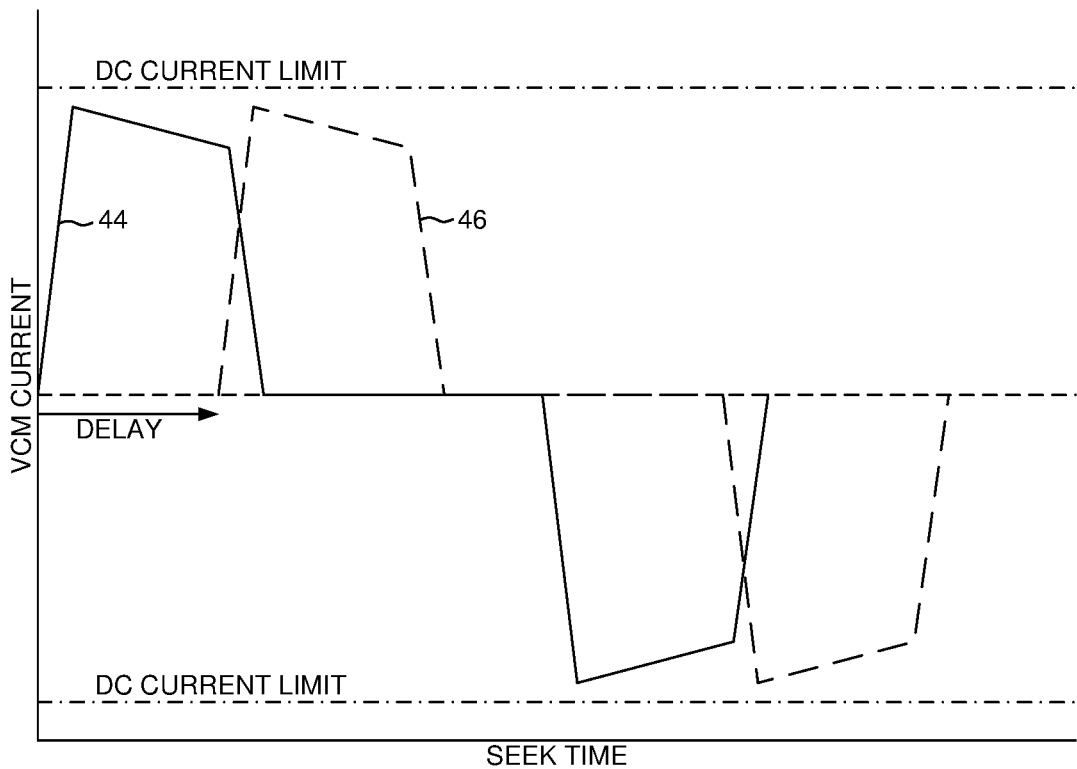
FIG. 5B shows an embodiment wherein the seek profiles of multiple VCMs are offset (by delaying at least one seek profile) so as to not exceed the detected current limit of the voltage source.

FIG. 5B shows an alternative embodiment for configuring the seek profile of multiple VCMs so as to avoid exceeding the detected current limit of the E-fuse. In this embodiment, the control circuitry may begin executing a first seek profile 44 for a first VCM 28A, and then after a predetermined delay, begin executing a second seek profile 46 for a second VCM 28B. In this manner, the combined VCM currents remains below the detected current limit of the E-fuse by reducing overlap during the acceleration and/or deceleration phases of the seeks.

In one embodiment, the control circuitry may configure the seek profiles for multiple VCMs such that the combined current may exceed the DC current limit of the E-fuse for a short duration without exceeding the transient (AC) current limit of the E-fuse. For example, the combined seek profile 42 in FIG. 5A may exceed the DC current limit for a transient duration, or the delay of the seek profiles in FIG. 5B may be configured so that the combined VCM current may exceed the DC current limit for a transient duration, thereby maximizing the performance without the E-fuse disrupting operation of the disk drive.

In one embodiment, a detected load voltage and a detected load current of the disk drive may be monitored while executing a seek operation of one or more VCMs in order to detect whether the current limit of the E-fuse is being exceeded. When an excessive current condition is detected, the control circuitry may modify the seek(s) in progress in order to prevent an overload condition. In one embodiment, the control circuitry may adaptively adjust the detected current limit of the E-fuse based on whether the current limit is exceeded during normal seek operations. For example, in one embodiment the control circuitry may step increase the performance of the seek profiles (by increasing the seek current) until the current limit of the E-fuse is reached. The control circuitry may then back-off the performance of the seek profiles by a predetermined margin so as not to exceed the detect current limit during subsequent seek operations. The control circuitry may periodically step increase the performance of the seek profiles in order to recalibrate the detected current limit of the E-fuse. For example, in one embodiment the current limit of the E-fuse may vary over time due, for example, to changes in environmental conditions (e.g., ambient temperature).

Figure 6:
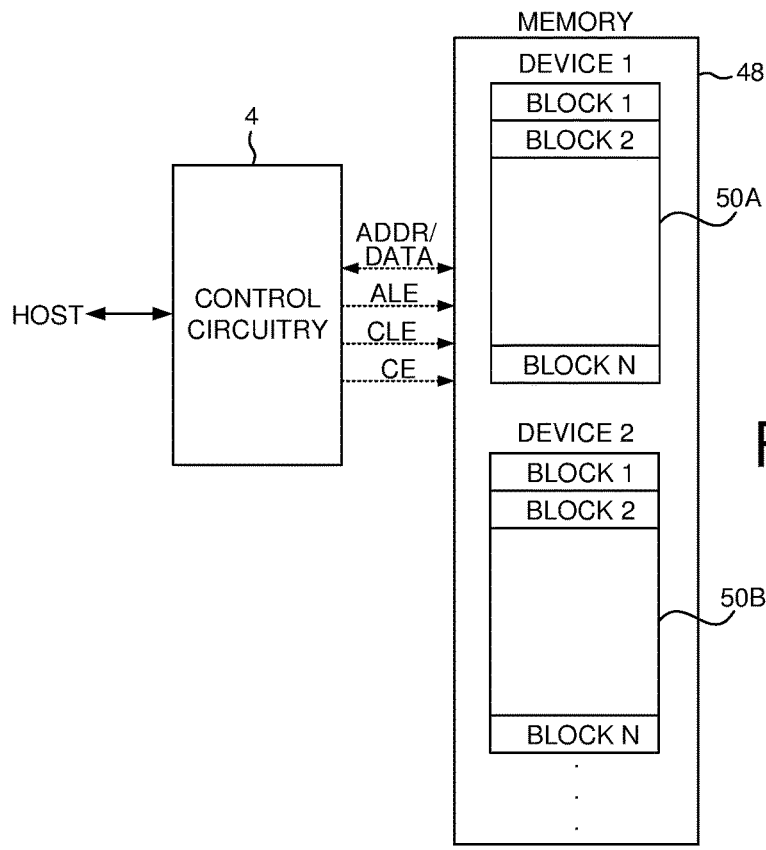
FIG. 6 shows a data storage device in the form of a solid state drive (SSD) according to an embodiment comprising a number of memory devices that may be accessed concurrently.
Figure 7A:
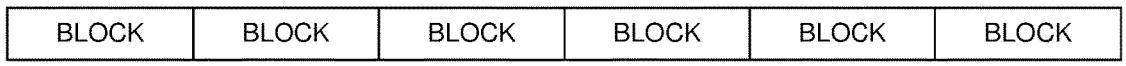
FIG. 7A shows an embodiment wherein multiple read channels may concurrently process multiple data streams (e.g., from multiple disk surfaces or multiple memory devices).
Figure 7A:
Figure 7B:
FIG. 7B shows an embodiment wherein the concurrent processing of multiple data streams may be interleaved so as to access throttle the data storage device and avoid exceeding the detected current limit of the voltage source.
Figure 7B:

The data storage device of FIG. 1A may comprise any suitable storage medium 2, wherein in an embodiment shown in FIG. 6, the storage medium may comprise a non-volatile semiconductor memory (NVSM) 48 of a solid state drive (SSD). The non-volatile semiconductor memory 48 may comprise a number of individual memory devices, 50A, 50B, etc., for storing a number of data blocks. In one embodiment, the control circuitry 4 may comprise multiple read channels as shown in FIG. 7A for concurrently accessing two or more of the memory devices in order to increase throughput. However, concurrently accessing multiple memory devices (or multiple disk surfaces) may exceed the current limit of the E-fuse. Accordingly, in one embodiment the control circuitry 4 may configure an access throttling of the data storage device so as to not exceed the detected current limit of the E-fuse. An example of access throttling is shown in the embodiment of FIG. 7B wherein the operation of multiple read channels may be interleaved in order to reduce the combined load of the read channels. In one embodiment, the amount of overlap between the multiple read channels may be adjusted based on the detected current limit (AC or DC) of the E-fuse. In another embodiment, the access throttling may be implemented by adjusting a clock speed of multiple, overlapping read channels based on the detected current limit, wherein the clocking speed may be increased as the detected current limit increases.

In the embodiment of FIG. 1C, any suitable E-fuse 22 or E-fuse type device may be employed that is capable of limiting the maximum current flowing from the power supply 20 to the DSD 18. In one embodiment, the E-fuse may comprise any suitable active circuitry, such as a field effect transistor (FET) controlled by current sensing circuitry. In this embodiment, the E-fuse may operate as a transient fuse that may reset once the load current decreases below the current limit of the E-fuse. In other embodiments, the E-fuse may comprise any suitable passive circuitry (e.g., a wire) that may exhibit an increased resistance prior to the E-fuse blowing. In this embodiment, the control circuitry 4 within the DSD 18 may adjust the load current so as to prevent the E-fuse from reaching a blown (permanently disabled) state.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry. In some embodiments, at least some of the flow diagram blocks may be implemented using analog circuitry (e.g., analog comparators, timers, etc.), and in other embodiments at least some of the blocks may be implemented using digital circuitry or a combination of analog/digital circuitry.

In various embodiments, a data storage device may include a magnetic disk drive, an optical disk drive, a hybrid disk drive, a solid state drive, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-transitory machine readable storage medium;
an input configured to receive a supply voltage from a voltage source; and
control circuitry powered by the supply voltage, wherein the control circuitry is configured to:
adjust a load of the data storage device;
detect a load voltage at the adjusted load;
detect a load current at the adjusted load;
process the detected load voltage and the detected load current to detect a current limit of the voltage source; and
configure the data storage device in response to the detected current limit of the voltage source.

2. The data storage device as recited in claim 1, wherein the control circuitry is further configured to:
detect a resistance of the voltage source based on the detected load voltage and the detected load current; and
detect the current limit of the voltage source in response to the detected resistance.

3. The data storage device as recited in claim 1, wherein the control circuitry is further configured to detect the current limit of the voltage source when a slope polarity of the detected load voltage matches a slope polarity of the detected load current during at least part of a transient load condition.

4. The data storage device as recited in claim 1, wherein the non-transitory machine readable storage medium comprises a disk accessed using a head, and the control circuitry is further configured to adjust a seek profile for seeking the head over the disk in response to the detected current limit of the voltage source.

5. The data storage device as recited in claim 4, wherein the control circuitry is further configured to adjust the seek profile by decreasing an acceleration of the seek profile.

6. The data storage device as recited in claim 4, wherein the control circuitry is further configured to adjust the seek profile by increasing a delay of the seek profile.

7. The data storage device as recited in claim 1, wherein the non-transitory machine readable storage medium comprises a non-volatile semiconductor memory (NVSM) and the control circuitry is further configured to configure an access throttling of the NVSM in response to the detected current limit of the voltage source.

8. A data storage device comprising:
a non-transitory machine readable storage medium;
an input configured to receive a supply voltage from a voltage source; and
control circuitry powered by the supply voltage, wherein the control circuitry is configured to:
detect a current limit of the voltage source caused by a load condition while accessing the non-transitory machine readable storage medium; and
configure the data storage device to reduce the load condition in response to the detected current limit of the voltage source.

9. The data storage device as recited in claim 8, wherein the control circuitry is further configured to:
adjust a load of the data storage device,
detect a load voltage at the adjusted load;
detect a load current at the adjusted load;
detect a resistance of the voltage source based on the detected load voltage and the detected load current; and
detect the current limit of the voltage source in response to the detected resistance.

10. The data storage device as recited in claim 8, wherein the control circuitry is further configured to:
adjust a load of the data storage device,
detect a load voltage at the adjusted load;
detect a load current at the adjusted load; and
detect the current limit of the voltage source when a slope polarity of the detected load voltage matches a slope polarity of the detected load current during at least part of the load condition.

11. The data storage device as recited in claim 8, wherein the non-transitory machine readable storage medium comprises a disk accessed using a head, and the control circuitry is further configured to adjust a seek profile for seeking the head over the disk in order to reduce the load condition in response to the detected current limit of the voltage source.

12. The data storage device as recited in claim 11, wherein the control circuitry is further configured to adjust the seek profile by decreasing an acceleration of the seek profile.

13. The data storage device as recited in claim 11, wherein the control circuitry is further configured to adjust the seek profile by increasing a delay of the seek profile.

14. The data storage device as recited in claim 8, wherein the non-transitory machine readable storage medium comprises a non-volatile semiconductor memory (NVSM), and the control circuitry is further configured to increase an access throttling of the NVSM in order to reduce the load condition in response to the detected current limit of the voltage source.

15. A data storage device comprising:
a non-transitory machine readable storage medium;
an input configured to receive a supply voltage from a voltage source;
a means for detecting a current limit of the supply voltage; and
a means for configuring the data storage device in response to the detected current limit of the supply voltage.

16. The data storage device as recited in claim 15, further comprising:
a means for adjusting a load of the data storage device;
a means for detecting a load voltage at the adjusted load; and
a means for detecting a load current at the adjusted load;
wherein the means for detecting the current limit of the supply voltage comprises a means for detecting when a slope polarity of the detected load voltage matches a slope polarity of the detected load current.

17. The data storage device as recited in claim 15, wherein the non-transitory machine readable storage medium comprises a disk accessed using a head, and the means for configuring the data storage device comprises a means for adjusting a seek profile for seeking the head over the disk in response to the detected current limit of the supply voltage.

18. The data storage device as recited in claim 17, wherein the means for adjusting the seek profile comprises a means for decreasing an acceleration of the seek profile.

19. The data storage device as recited in claim 17, wherein the means for adjusting the seek profile comprises a means for increasing a delay of the seek profile.

20. The data storage device as recited in claim 15, wherein the non-transitory machine readable storage medium comprises a non-volatile semiconductor memory (NVSM), and the means for configuring the data storage device comprises a means for increasing an access throttling of the NVSM in response to the detected current limit of the voltage source.

* * * * *